US012651920B2

(12) United States Patent
Ho et al.

(10) Patent No.:    US 12,651,920 B2
(45) Date of Patent:        Jun. 9, 2026

(54) BATTERY STATE OF HEALTH CALIBRATION SYSTEM

(71) Applicant: Dell Products L.P., Round Rock, TX (US)

(72) Inventors: Lawrence Ho, New Taipei City (TW); Yida Zeng, Sanmin District (TW)

(73) Assignee: Dell Products L.P., Round Rock, TX (US)

( * ) Notice:    Subject to any disclaimer, the term of this patent is extended or adjusted under 35 U.S.C. 154(b) by 1099 days.

(21) Appl. No.: 17/715,846

(22) Filed:    Apr. 7, 2022

(65)    Prior Publication Data

US 2023/0327466 A1    Oct. 12, 2023

(51) Int. Cl.

| | |
|---|---|
| *H02J 7/82* | (2026.01) |
| *G01R 31/3835* | (2019.01) |
| *G01R 31/388* | (2019.01) |
| *G01R 31/392* | (2019.01) |
| *G01R 31/396* | (2019.01) |
| *G06F 1/28* | (2006.01) |
| *G06F 1/3212* | (2019.01) |
| *G06F 11/00* | (2006.01) |
| *G06F 11/30* | (2006.01) |
| *H02J 7/50* | (2026.01) |
| *H02J 7/84* | (2026.01) |
| *H02J 7/90* | (2026.01) |
| *G01R 31/389* | (2019.01) |
| *G06F 1/26* | (2006.01) |
| *G06F 1/30* | (2006.01) |

(Continued)

(52) U.S. Cl.
CPC .......... *H02J 7/825* (2026.01); *G01R 31/3835* (2019.01); *G01R 31/388* (2019.01); *G01R 31/392* (2019.01); *G01R 31/396* (2019.01);

*G06F 1/28* (2013.01); *G06F 1/3212* (2013.01); *G06F 11/008* (2013.01); *G06F 11/3062* (2013.01); *H02J 7/50* (2026.01); *H02J 7/82* (2026.01); *H02J 7/84* (2026.01); *H02J 7/933* (2026.01); *G01R 31/389* (2019.01); *G06F 1/263* (2013.01); *G06F 1/30* (2013.01); *H01M 2010/4271* (2013.01); *H02J 7/80* (2026.01)

(58) Field of Classification Search
CPC ...... H02J 7/0049; H02J 7/0013; H02J 7/0048; H02J 7/005; H02J 7/00712; H02J 7/0047; H02J 7/825; H02J 7/50; H02J 7/82; H02J 7/84; H02J 7/933; H02J 7/80; G01R 31/3835; G01R 31/388; G01R 31/392; G01R 31/396; G01R 31/389; G06F 1/3212; G06F 11/008; G06F 11/3062; G06F 1/28; G06F 1/263; G06F 1/30; H01M 2010/4271
USPC ........................................................ 320/134
See application file for complete search history.

(56)    References Cited

U.S. PATENT DOCUMENTS

| | | | | |
|---|---|---|---|---|
| 8,129,946 | B2 | 3/2012 | Wang et al. | |
| 8,564,447 | B2 * | 10/2013 | Trock ..................... | G08B 21/18 |
| | | | | 340/637 |

(Continued)

*Primary Examiner* — Julian D Huffman
(74) *Attorney, Agent, or Firm* — Larson Newman, LLP

(57)    ABSTRACT

A battery management system determines whether a maximum error of a battery is greater than a threshold, and in response to a determination that the maximum error is greater than the threshold, determines whether the battery is fully charged. In response to a determination that the battery is fully charged, the system discharges the battery based on a reserve capacity.

20 Claims, 6 Drawing Sheets

200

(51) Int. Cl.
    *H01M 10/42*        (2006.01)
    *H02J 7/80*         (2026.01)

(56)                References Cited

U.S. PATENT DOCUMENTS 10,794,958  B2   10/2020  Chang et al.
  2014/0117945  A1    5/2014  Verdun et al.
  2015/0037624  A1    2/2015  Thompson et al.
  2015/0253830  A1    9/2015  Montero et al.
  2015/0256004  A1    9/2015  Miller et al.
  2016/0359344  A1   12/2016  Chin et al.
  2017/0212169  A1    7/2017  Wang et al.
  2018/0109116  A1    4/2018  LaMarre et al.
  2020/0132778  A1    4/2020  Thompson et al.
  2020/0373632  A1   11/2020  Fang et al.
  2021/0155116  A1*   5/2021  Wang ..................... B60L 58/22
  2021/0271303  A1    9/2021  Vichare et al.

* cited by examiner

Information Handling System

102 Processor

104 Processor

134 Video Display

120 Memory

122

110 106

Chipset

108

132

130 136 Graphics Interface

112

140 NVRAM
142
BIOS/ EFI

192

170 I/O Interface

150 Disk Controller

176 TPM

180 Network Interface 174 172 Add-On Resource

156 ODD

152

154 HDD

190 BMC

182

160 Disk Emulator

194

164 162

Solid State Drive

500

600

BATTERY STATE OF HEALTH CALIBRATION SYSTEM

FIELD OF THE DISCLOSURE

The present disclosure generally relates to information handling systems, and more particularly relates to battery state of health calibration system.

BACKGROUND

As the value and use of information continues to increase, individuals and businesses seek additional ways to process and store information. One option is an information handling system. An information handling system generally processes, compiles, stores, or communicates information or data for business, personal, or other purposes. Technology and information handling needs and requirements can vary between different applications. Thus, information handling systems can also vary regarding what information is handled, how the information is handled, how much information is processed, stored, or communicated, and how quickly and efficiently the information can be processed, stored, or communicated. The variations in information handling systems allow information handling systems to be general or configured for a specific user or specific use such as financial transaction processing, airline reservations, enterprise data storage, or global communications. In addition, information handling systems can include a variety of hardware and software resources that can be configured to process, store, and communicate information and can include one or more computer systems, graphics interface systems, data storage systems, networking systems, and mobile communication systems. Information handling systems can also implement various virtualized architectures. Data and voice communications among information handling systems may be via networks that are wired, wireless, or some combination.

SUMMARY

A battery management system determines whether a maximum error of a battery is greater than a threshold, and if so then determines whether the battery is fully charged. If the battery is fully charged, the system discharges the battery based on a reserve capacity.

BRIEF DESCRIPTION OF THE DRAWINGS

It will be appreciated that for simplicity and clarity of illustration, elements illustrated in the Figures are not necessarily drawn to scale. For example, the dimensions of some elements may be exaggerated relative to other elements. Embodiments incorporating teachings of the present disclosure are shown and described with respect to the drawings herein, in which.

The use of the same reference symbols in different drawings indicates similar or identical items.

DETAILED DESCRIPTION OF THE DRAWINGS

The following description in combination with the Figures is provided to assist in understanding the teachings disclosed herein. The description is focused on specific implementations and embodiments of the teachings and is provided to assist in describing the teachings. This focus should not be interpreted as a limitation on the scope or applicability of the teachings.

Figure 1:
FIG. 1 is a block diagram illustrating an information handling system according to an embodiment of the present disclosure.

FIG. 1 illustrates an embodiment of an information handling system 100 including processors 102 and 104, a chipset 110, a memory 120, a graphics adapter 130 connected to a video display 134, a non-volatile RAM (NV-RAM) 140 that includes a basic input and output system/ extensible firmware interface (BIOS/EFI) module 142, a disk controller 150, a hard disk drive (HDD) 154, an optical disk drive 156, a disk emulator 160 connected to a solid-state drive (SSD) 164, an input/output (I/O) interface 170 connected to an add-on resource 174 and a trusted platform module (TPM) 176, a network interface 180, and a baseboard management controller (BMC) 190. Processor 102 is connected to chipset 110 via processor interface 106, and processor 104 is connected to the chipset via processor interface 108. In a particular embodiment, processors 102 and 104 are connected together via a high-capacity coherent fabric, such as a HyperTransport link, a QuickPath Interconnect, or the like. Chipset 110 represents an integrated circuit or group of integrated circuits that manage the data flow between processors 102 and 104 and the other elements of information handling system 100. In a particular embodiment, chipset 110 represents a pair of integrated circuits, such as a northbridge component and a southbridge component. In another embodiment, some or all of the functions and features of chipset 110 are integrated with one or more of processors 102 and 104.

Memory 120 is connected to chipset 110 via a memory interface 122. An example of memory interface 122 includes a Double Data Rate (DDR) memory channel and memory 120 represents one or more DDR Dual In-Line Memory Modules (DIMMs). In a particular embodiment, memory interface 122 represents two or more DDR channels. In another embodiment, one or more of processors 102 and 104 include a memory interface that provides a dedicated memory for the processors. A DDR channel and the connected DDR DIMMs can be in accordance with a particular DDR standard, such as a DDR3 standard, a DDR4 standard, a DDR5 standard, or the like.

Memory 120 may further represent various combinations of memory types, such as Dynamic Random Access Memory (DRAM) DIMMs, Static Random Access Memory (SRAM) DIMMs, non-volatile DIMMs (NV-DIMMs), storage class memory devices, Read-Only Memory (ROM) devices, or the like. Graphics adapter 130 is connected to chipset 110 via a graphics interface 132 and provides a video display output 136 to a video display 134. An example of a graphics interface 132 includes a Peripheral Component Interconnect-Express (PCIe) interface and graphics adapter 130 can include a four-lane (×4) PCIe adapter, an eight-lane (×8) PCIe adapter, a 16-lane (×16) PCIe adapter, or another configuration, as needed or desired. In a particular embodiment, graphics adapter 130 is provided down on a system printed circuit board (PCB). Video display output 136 can include a Digital Video Interface (DVI), a High-Definition Multimedia Interface (HDMI), a DisplayPort interface, or the like, and video display 134 can include a monitor, a smart television, an embedded display such as a laptop computer display, or the like.

NV-RAM 140, disk controller 150, and I/O interface 170 are connected to chipset 110 via an I/O channel 112. An example of I/O channel 112 includes one or more point-to-point PCIe links between chipset 110 and each of NV-RAM 140, disk controller 150, and I/O interface 170. Chipset 110 can also include one or more other I/O interfaces, including a PCIe interface, an Industry Standard Architecture (ISA) interface, a Small Computer Serial Interface (SCSI) interface, an Inter-Integrated Circuit (I2C) interface, a System Packet Interface (SPI), a Universal Serial Bus (USB), another interface, or a combination thereof. NV-RAM 140 includes BIOS/EFI module 142 that stores machine-executable code (BIOS/EFI code) that operates to detect the resources of information handling system 100, to provide drivers for the resources, to initialize the resources, and to provide common access mechanisms for the resources. The functions and features of BIOS/EFI module 142 will be further described below.

Disk controller 150 includes a disk interface 152 that connects the disc controller to a hard disk drive (HDD) 154, to an optical disk drive (ODD) 156, and to disk emulator 160. An example of disk interface 152 includes an Integrated Drive Electronics (IDE) interface, an Advanced Technology Attachment (ATA) such as a parallel ATA (PATA) interface or a serial ATA (SATA) interface, a SCSI interface, a USB interface, a proprietary interface, or a combination thereof. Disk emulator 160 permits SSD 164 to be connected to information handling system 100 via an external interface 162. An example of external interface 162 includes a USB interface, an institute of electrical and electronics engineers (IEEE) 1394 (Firewire) interface, a proprietary interface, or a combination thereof. Alternatively, SSD 164 can be disposed within information handling system 100.

I/O interface 170 includes a peripheral interface 172 that connects the I/O interface to add-on resource 174, to TPM 176, and to network interface 180. Peripheral interface 172 can be the same type of interface as I/O channel 112 or can be a different type of interface. As such, I/O interface 170 extends the capacity of I/O channel 112 when peripheral interface 172 and the I/O channel are of the same type, and the I/O interface translates information from a format suitable to the I/O channel to a format suitable to the peripheral interface 172 when they are of a different type. Add-on resource 174 can include a data storage system, an additional graphics interface, a network interface card (NIC), a sound/video processing card, another add-on resource, or a combination thereof. Add-on resource 174 can be on a main circuit board, on a separate circuit board or add-in card disposed within information handling system 100, a device that is external to the information handling system, or a combination thereof.

Network interface 180 represents a network communication device disposed within information handling system 100, on a main circuit board of the information handling system, integrated onto another component such as chipset 110, in another suitable location, or a combination thereof. Network interface 180 includes a network channel 182 that provides an interface to devices that are external to information handling system 100. In a particular embodiment, network channel 182 is of a different type than peripheral interface 172, and network interface 180 translates information from a format suitable to the peripheral channel to a format suitable to external devices.

In a particular embodiment, network interface 180 includes a NIC or host bus adapter (HBA), and an example of network channel 182 includes an InfiniBand channel, a Fibre Channel, a Gigabit Ethernet channel, a proprietary channel architecture, or a combination thereof. In another embodiment, network interface 180 includes a wireless communication interface, and network channel 182 includes a Wi-Fi channel, a near-field communication (NFC) channel, a Bluetooth® or Bluetooth-Low-Energy (BLE) channel, a cellular based interface such as a Global System for Mobile (GSM) interface, a Code-Division Multiple Access (CDMA) interface, a Universal Mobile Telecommunications System (UMTS) interface, a Long-Term Evolution (LTE) interface, or another cellular based interface, or a combination thereof. Network channel 182 can be connected to an external network resource (not illustrated). The network resource can include another information handling system, a data storage system, another network, a grid management system, another suitable resource, or a combination thereof.

BMC 190 is connected to multiple elements of information handling system 100 via one or more management interface 192 to provide out-of-band monitoring, maintenance, and control of the elements of the information handling system. As such, BMC 190 represents a processing device different from processor 102 and processor 104, which provides various management functions for information handling system 100. For example, BMC 190 may be responsible for power management, cooling management, and the like. The term BMC is often used in the context of server systems, while in a consumer-level device a BMC may be referred to as an embedded controller (EC). A BMC included at a data storage system can be referred to as a storage enclosure processor. A BMC included at a chassis of a blade server can be referred to as a chassis management controller and embedded controllers included at the blades of the blade server can be referred to as blade management controllers. Capabilities and functions provided by BMC 190 can vary considerably based on the type of information handling system. BMC 190 can operate in accordance with an Intelligent Platform Management Interface (IPMI). Examples of BMC 190 include an Integrated Dell® Remote Access Controller (iDRAC).

Management interface 192 represents one or more out-of-band communication interfaces between BMC 190 and the elements of information handling system 100, and can include an Inter-Integrated Circuit (I2C) bus, a System Management Bus (SMBUS), a Power Management Bus (PMBUS), a Low Pin Count (LPC) interface, a serial bus such as a Universal Serial Bus (USB) or a Serial Peripheral Interface (SPI), a network interface such as an Ethernet interface, a high-speed serial data link such as a PCIe interface, a Network Controller Sideband Interface (NC-SI), or the like. As used herein, out-of-band access refers to operations performed apart from a BIOS/operating system execution environment on information handling system 100, that is apart from the execution of code by processors 102 and 104 and procedures that are implemented on the information handling system in response to the executed code.

BMC 190 operates to monitor and maintain system firmware, such as code stored in BIOS/EFI module 142, option ROMs for graphics adapter 130, disk controller 150, add-on resource 174, network interface 180, or other elements of information handling system 100, as needed or desired. In particular, BMC 190 includes a network interface 194 that can be connected to a remote management system to receive firmware updates, as needed or desired. Here, BMC 190 receives the firmware updates, stores the updates to a data storage device associated with the BMC, transfers the firmware updates to NV-RAM of the device or system that is the subject of the firmware update, thereby replacing the currently operating firmware associated with the device or system, and reboots information handling system, whereupon the device or system utilizes the updated firmware image.

BMC 190 utilizes various protocols and application programming interfaces (APIs) to direct and control the processes for monitoring and maintaining the system firmware. An example of a protocol or API for monitoring and maintaining the system firmware includes a graphical user interface (GUI) associated with BMC 190, an interface defined by the Distributed Management Taskforce (DMTF) (such as a Web Services Management (WSMan) interface, a Management Component Transport Protocol (MCTP) or, a Redfish® interface), various vendor-defined interfaces (such as a Dell EMC Remote Access Controller Administrator (RACADM) utility, a Dell EMC OpenManage Enterprise, a Dell EMC OpenManage Server Administrator (OMSS) utility, a Dell EMC OpenManage Storage Services (OMSS) utility, or a Dell EMC OpenManage Deployment Toolkit (DTK) suite), a BIOS setup utility such as invoked by a "F2" boot option, or another protocol or API, as needed or desired.

In a particular embodiment, BMC 190 is included on a main circuit board (such as a baseboard, a motherboard, or any combination thereof) of information handling system 100 or is integrated onto another element of the information handling system such as chipset 110, or another suitable element, as needed or desired. As such, BMC 190 can be part of an integrated circuit or a chipset within information handling system 100. An example of BMC 190 includes an iDRAC or the like. BMC 190 may operate on a separate power plane from other resources in information handling system 100. Thus BMC 190 can communicate with the management system via network interface 194 while the resources of information handling system 100 are powered off. Here, information can be sent from the management system to BMC 190 and the information can be stored in a RAM or NV-RAM associated with the BMC. Information stored in the RAM may be lost after power-down of the power plane for BMC 190, while information stored in the NV-RAM may be saved through a power-down/power-up cycle of the power plane for the BMC.

Information handling system 100 can include additional components and additional busses, not shown for clarity. For example, information handling system 100 can include multiple processor cores, audio devices, and the like. While a particular arrangement of bus technologies and interconnections is illustrated for the purpose of example, one of skill will appreciate that the techniques disclosed herein are applicable to other system architectures. Information handling system 100 can include multiple central processing units (CPUs) and redundant bus controllers. One or more components can be integrated together. Information handling system 100 can include additional buses and bus protocols, for example, I2C and the like. Additional components of information handling system 100 can include one or more storage devices that can store machine-executable code, one or more communications ports for communicating with external devices, and various input and output (I/O) devices, such as a keyboard, a mouse, and a video display.

For purpose of this disclosure information handling system 100 can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, information handling system 100 can be a personal computer, a laptop computer, a smartphone, a tablet device or other consumer electronic device, a network server, a network storage device, a switch, a router, or another network communication device, or any other suitable device and may vary in size, shape, performance, functionality, and price. Further, information handling system 100 can include processing resources for executing machine-executable code, such as processor 102, a programmable logic array (PLA), an embedded device such as a System-on-a-Chip (SoC), or other control logic hardware. Information handling system 100 can also include one or more computer-readable media for storing machine-executable code, such as software or data.

An information handling system may be connected to a battery backup unit that provides power in the event of a power outage. For example, when the main power unit shuts down, the battery backup unit provides power to perform data backup or shutdown of the information handling system. The battery backup unit is typically maintained in a fully charged state. However, maintaining the battery backup unit in a fully charged state without occasionally discharging the battery backup unit may result in an inaccurate full charge capacity assessment. The full charge capacity refers to the amount of charge a battery can hold and is typically estimated by a battery management system. However, because the full charge capacity degrades during the lifespan of a battery, an estimate of the full charge capacity of the battery may not reflect the degradation of the battery resulting in inaccurate estimates. For example, the battery health can degrade such that the total charge capacity can be significantly less than that of the original battery rating. Inaccurate full charge capacity may impact the ability to help ensure that the battery backup unit has enough power to provide for a proper transfer of data or shutdown during the power outage. To address these issues, the present disclosure provides a system and method for automated battery state of health calibration that allows the system to maintain the battery's ability to provide the power required by the information handling system during an interrupt to the main power. In addition, the automated calibration allows a fuel gauge interface to match the estimated full charge capacity to the actual capacity of the battery.

Figure 2:
FIG. 2 is a block diagram illustrating an example of a battery state of health calibration system, according to an embodiment of the present disclosure.
Figure 2:
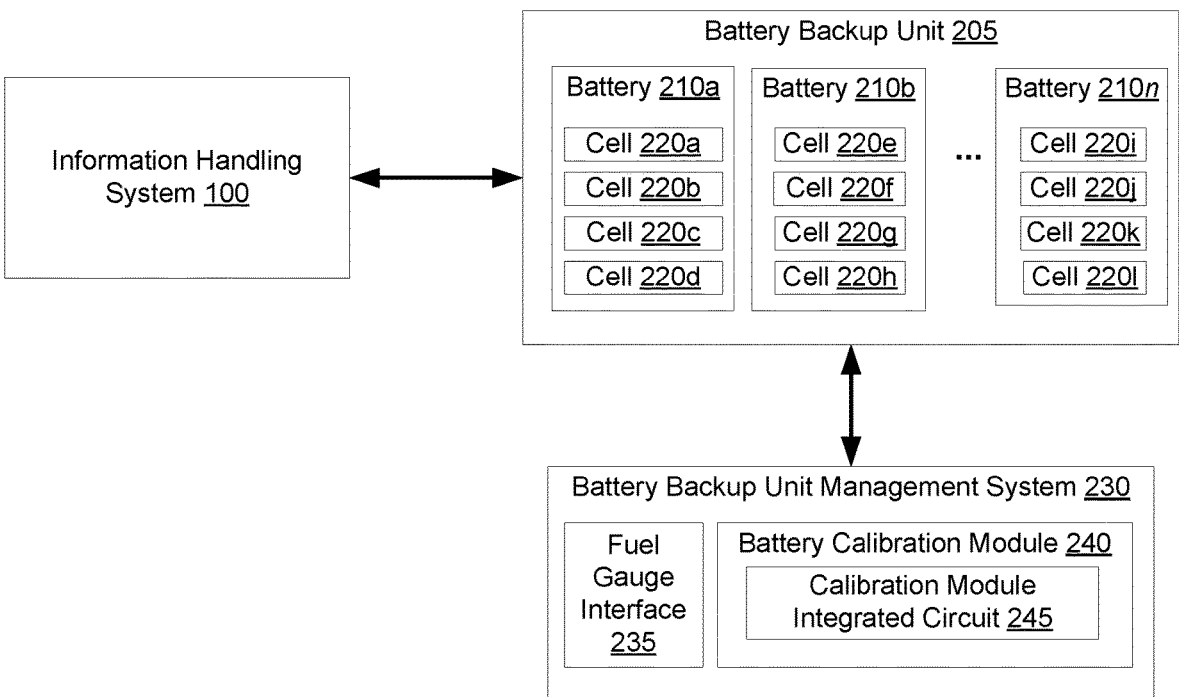

FIG. 2 shows an example of a system 200 for automatic battery state of health calibration. System 200 includes information handling system 100, a battery backup unit 205, and a battery backup unit management system 230. Battery backup unit management system 230 includes a fuel gauge interface 235, a battery calibration module 240, and a calibration module integrated circuit 245. In addition, battery backup unit management system 230, also referred to as a battery management system may include an interface, a memory, a processor, a storage device, and computer-readable media. The fuel gauge interface 235 may be similar to I/O interface 170 of FIG. 1 and may include a user interface, a display interface, or similar. The memory may be similar to memory 120 while the processor may be similar to processor 102 of FIG. 1. Also, the storage device may be similar to SSD 164, HDD 154, or similar. The components of system 200 may be implemented in hardware, software, firmware, or any combination thereof. In addition, the components shown are not drawn to scale and system 200 may include additional or fewer components. Furthermore, some components that are represented as separate components may in certain embodiments instead are integrated with other components. For example, in certain embodiments, all or a portion of the functionality provided by the illustrated components may instead be provided by components integrated into one or more processor(s) as a system-on-a-chip. In addition, connections between components may be omitted for descriptive clarity.

Battery backup unit 205 includes one or more batteries such as a battery 210a-210n. Each battery includes one or more rechargeable battery cells. In this example, battery 210a includes cells 220a-220d. Battery 210b includes cells 220e-220h. Battery 210n includes cell 220i-220l. Although each battery is shown to have four battery cells, each battery may have more or less than four battery cells. Each battery cell may include any system, device, or apparatus capable of converting chemical energy into electrical energy (discharging) and/or vice versa (charging). For example, each cell may include an anode, cathode, separator, and electrolyte. The details of the battery backup unit and the batteries are known in the art and will not be further described herein, except as may be needed to illustrate the current embodiments.

In one embodiment, battery backup unit 205 may supply power to information handling system 100 when a power abnormality occurs such as a power outage or when there is insufficient power from the main power source. Thus, it is imperative that battery backup unit 205 is reliable. However, batteries typically suffer from degradation in performance and the ability to maintain charge capacity over time due to several factors such as temperature, age, and state of charge. As such, estimates associated with the battery such as its state of health may be incorrect. For example, information handling system 100 may suddenly shut down even though the fuel gauge interface 235 shows that the battery backup unit that it is fully charged. In another example, information handling system 100 may continue working even though the reading of the fuel gauge interface 235 shows that the battery backup unit is nearly dead. Therefore, it is typically recommended that battery backup units are regularly calibrated to keep the estimates of its various properties accurate.

Battery backup unit management system 230 may be configured to manage the performance and reliability of battery backup unit 205. Battery backup unit management system 230 may be configured to determine or perform an estimate of various properties of battery backup unit 205, such as its state of health, state of charge, full charge capacity, remaining capacity, how long battery backup unit 205 can provide power, etc. Information associated with the aforementioned properties may be displayed via fuel gauge interface 235. The state of charge of battery backup unit 205 is a measurement that represents the remaining capacity as a percentage of its usable capacity. In particular, the state of charge is the ratio of the available capacity and the maximum possible charge that can be stored in the battery. The state of health of battery backup unit 205 is its present condition or performance relative to a previous condition or performance, such as when battery backup unit 205 was first used. In other words, the state of health can include the current maximum capacity of the battery backup unit 205 compared to its original capacity. Fuel gauge 235 may also be configured to provide a "maximum error" which is an estimated accuracy of how reliable is the estimates provided. In other words, the maximum error is the expected margin of error that may occur during the calibration process. When the maximum error threshold is met, then a recalibration flag may be set which triggers a recalibration of battery backup unit 205.

Battery calibration module 240 may be configured to calibrate battery backup unit 205 such that it may regulate and/or monitor charging and/or discharging of battery backup unit 205. Battery calibration module 240 may include a processor and/or memory that may store information associated with calibrating battery backup unit 205. In addition, battery calibration module 240 may determine the maximum error which may be presented as a percentage in the state-of-charge calculation with a range of one to one hundred percent. A low reading indicates good accuracy and the reading increases as the precision diminishes. In one embodiment, when the battery is in storage for a while, such as when the battery is in storage longer than twenty-four hours, the maximum error may typically be an additional 0.05%. A maximum error threshold may be set by a static or dynamic variable that is used to determine whether the battery backup unit 205 is to be calibrated because the full charge capacity is deemed inaccurate. The maximum error threshold may be set by a user or battery calibration module 240 based on one or more factors such as battery type.

Another factor aside from the maximum error may also be used to determine whether to calibrate battery backup unit 205, such as the length of time that battery backup unit 205 is in storage. In one example, when the maximum error reaches over five percent and the battery has been in storage for longer than twenty-four hours, then battery backup unit management system 230 may transmit a signal to battery calibration module 240 to initiate the calibration process. In one example, calibration module integrated circuit 245 may be configured to calibrate each cell in battery backup unit 205, as explained below.

Figure 3:
FIG. 3 is a schematic diagram of a battery state of health calibration system, according to an embodiment of the present disclosure.
Figure 3:
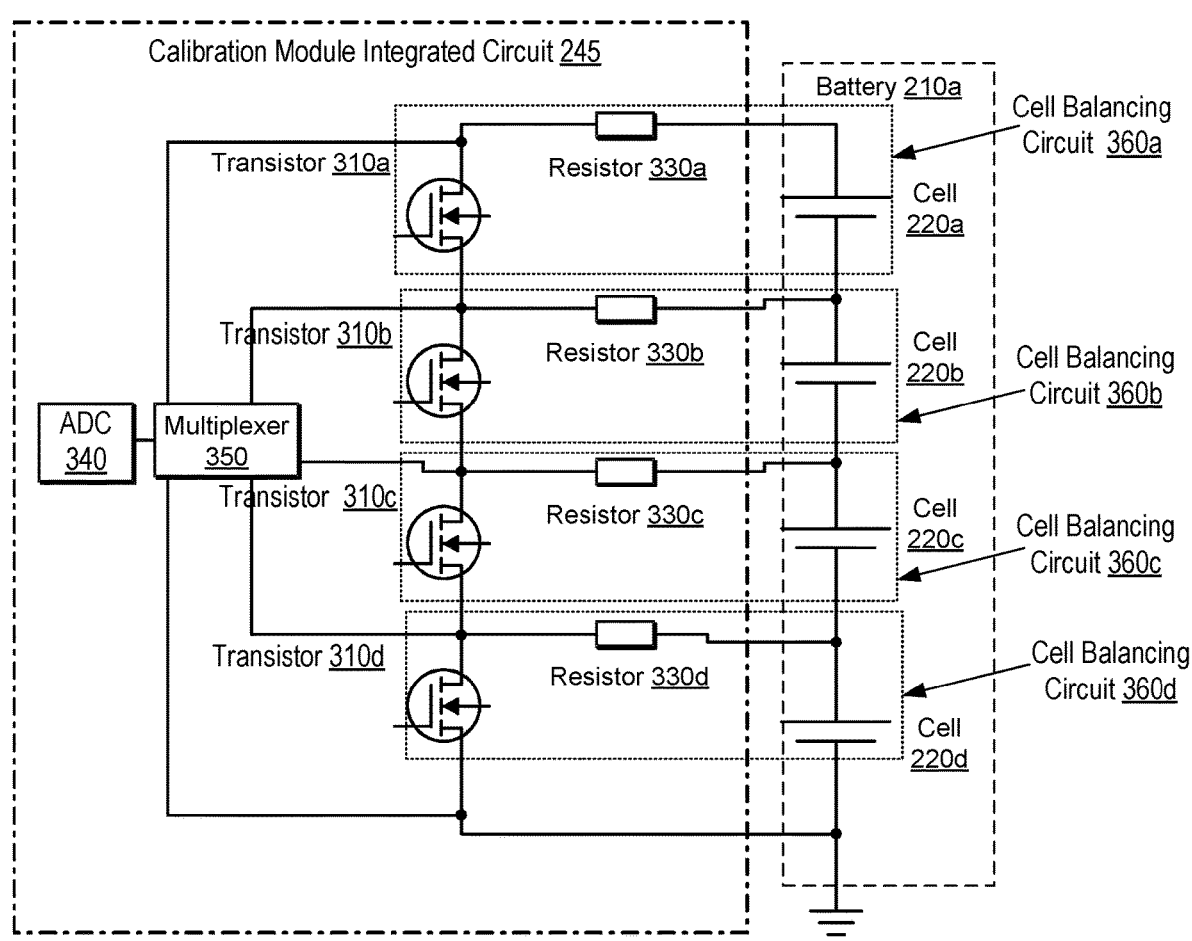

FIG. 3 shows an example of a system 300 for battery state of health calibration. In this example, system 300 performs a balanced calibration of cells 220a-220d of FIG. 2. Although system 300 includes calibration module integrated circuit 245 and battery 210a, system 300 may be configured to calibrate other battery cells of battery backup unit 205. For example, calibration module integrated circuit 245 may be configured to calibrate cells of batteries 210b-210n. Calibration module integrated circuit 245 includes an analog/digital converter (ADC) 340, a multiplexer 350, transistors 310a-310d, and resistors 330a-330d.

Over time, imbalance in the state of battery cells, such as cells 220a-220d reduces the capacity of battery 210a. Cell balancing that equalizes the battery cells allows the battery to operate longer. Calibration module integrated circuit 245 may be configured to perform cell balancing by utilizing a cell balancing circuit such as cell balancing circuits 230a-230d. Each of cell balancing circuits 230a-230d includes a transistor and a transistor associated with a battery cell. The transistor may be a field-effect transistor (FET) or a metal-oxide-semiconductor field-effect transistor (MOSFET), which may be used to as a switch that controls the flow of power, such as via switch duty cycle, to the load or the resistor. When the transistor signal is high then the transistor is enabled, the transistor may draw a current through the resistors and discharges the corresponding battery cell. Accordingly, when the transistor signal is low then the transistor is disabled and the battery cell is charged. During the cell balancing, battery calibration module 240 of FIG. 2 may measure various properties of the battery such as cell impedance, and perform calculations. For example, battery calibration module 240 may calculate the full charge capacity, state of health, state of charge, maximum error, remaining capacity, etc. associated with battery 210a and/or battery backup unit 205. The battery cell impedance may be measured by loading the battery cell with a current and measuring the output voltage. Dividing the output voltage by output current results in the cell impedance.

Each one of transistors 310a-310d may be selectively activated, such as enabled, closed, or turned on, to complete an electrical circuit that is to create a conductive path between two points. Also, each of transistors 310a-310d may be selectively deactivated, such as disabled, open, or turned off to break an electrical circuit which is to break a conductive path between two points. The transistors may be activated and deactivated by a respective control signal which may be applied to a gate of the transistor. Multiplexer 350 may be configured to select which one of the transistors to be activated and close a cell balancing circuit. The transistor may be configured to act as a switch thus controlling the switch duty cycle.

ADC 340 may be configured to detect and measure voltage and current applied to calibration module integrated circuit 245. While multiplexer 350 may be configured to select which transistor to enable by applying the voltage. As such, when the transistor is enabled, it will draw current to its associated resistor and charging or discharging the corresponding cell via a cell balancing circuit. In other words, multiplexer 350 may be configured to determine which cell balancing circuit, such as which of cell balancing circuits 230a-230d is utilized. The selection is performed such as a single cell is charged or discharged. This is so that rise in temperature during the cell balancing is minimized Cell balancing circuit 360a which includes transistor 310a, resistor 330a, and cell 220a is associated with switch duty cycle 410a. As such, cell balancing circuit 230a may be configured to charge or discharge cell 220a. Cell balancing circuit 360b which includes transistor 310b, resistor 330b, and cell 220b is associated with switch duty cycle 410b. As such, cell balancing circuit 230b may be configured to charge or discharge cell 220b. Cell balancing circuit 360c which includes transistor 310c, resistor 330c, and cell 220c is associated with switch duty cycle 410c. As such, cell balancing circuit 360c may be configured to charge or discharge cell 220c. Cell balancing circuit 360d which includes transistor 310d, resistor 330d, and cell 220d is associated with switch duty cycle 410d. As such, cell balancing circuit 360d may be configured to charge or discharge cell 220d.

Figure 4:
FIG. 4 is a diagram illustrating examples of waveforms for the battery state of health calibration system, according to an embodiment of the present disclosure.
Figure 4:
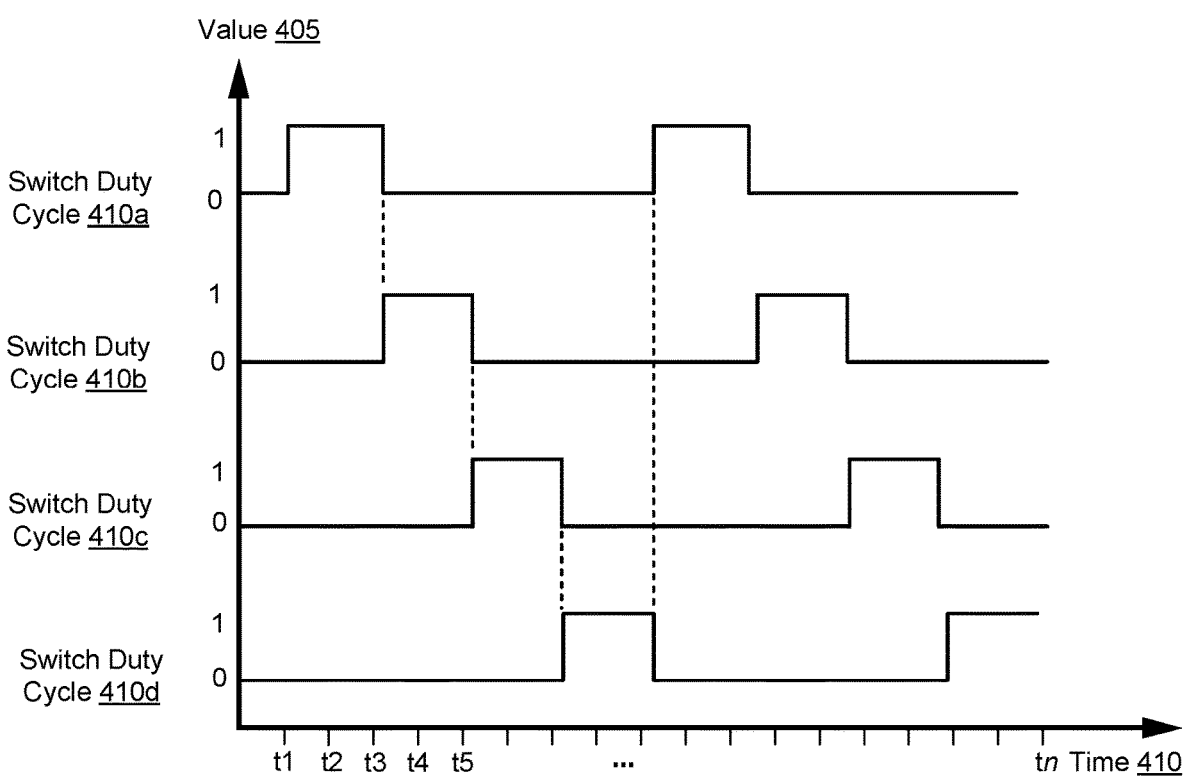

FIG. 4 shows a graph 400 illustrating waveforms corresponding to switch duty cycles applied at calibration module integrated circuit 245. Graph 400 includes a vertical axis value 405 representing a value of the amplitude of the switch duty cycle. In this example, a positive amplitude signal is when the transistor signal is high or has a value of one. A baseline amplitude signal is when the transistor signal is low or has a value of zero. Graph 400 also includes a horizontal axis time 410 representing time.

Graph 400 shows waveforms of switch duty cycles 410a-410d. In particular, graph 400 shows an application of cell balancing circuits across the different cells in battery 210a. For example, when the transistor signal of switch duty cycle 410a is high, the signals of the other switch duty cycles 410b-410d are low. As such, when the transistor signal of switch duty cycle 410a is high, cell 220a is being discharged while cells 220b-220d are being charged. When the transistor signal of switch duty cycle 410b is high the transistor signals of switch duty cycles 410a and 410c-410d are low. As such, when the transistor signal of switch duty cycle 410b is high, cell 220b is being discharged while cells 220a and 220c-220d are being charged. When the transistor signal of switch duty cycle 410c is high the transistor signals of switch duty cycles 410a-410b and 410d are low. As such, when the transistor signal of switch duty cycle 410c is high, cell 220c is being discharged while cells 220a-220b and 220d are being charged. When the transistor signal of switch duty cycle 410d is high the transistor signals of switch duty cycles 410a-410c are low. As such, when the transistor signal of switch duty cycle 410c is high, cell 220d is being discharged while cells 220a-220c are being charged. By controlling the amplitude of switch duty cycles 410a-410d each of cell balancing circuits 230a-230d discharges the battery cells at different intervals.

Figure 5:
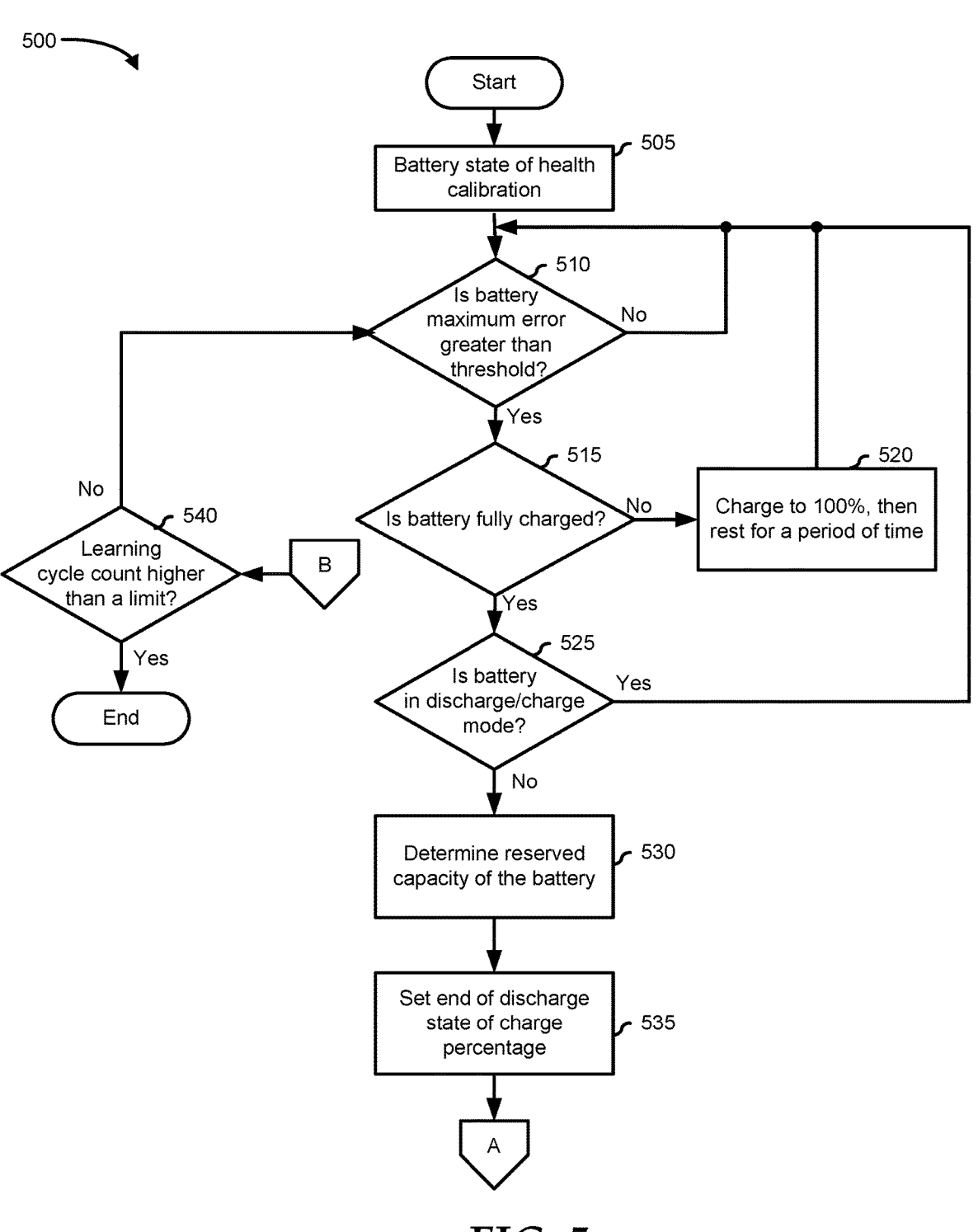
FIG. 5 and FIG. 6 are flowcharts illustrating an example of a method for battery state of health calibration, according to an embodiment of the present disclosure.

FIG. 5 shows a flowchart of a method 500 for battery state of health calibration system. Method 500 may be performed by components of system 200 such as battery backup unit management system 230 of FIG. 2. However, while embodiments of the present disclosure are described in terms of system 200 of FIG. 2, it should be recognized that other systems may be utilized to perform the described method. One of skill in the art will appreciate that this flowchart explains a typical example, which can be extended to advanced applications or services in practice.

Method 500 typically starts at block 505, where the method enables an automated battery state of health calibration process and maximum error associated with the battery and/or battery backup unit. At this point, a learning cycle parameter value may be set to one. The learning cycle is when the battery backup unit management system performs the calibration to determine the battery's condition by performing calculations or estimating one or more properties of the battery or the battery backup unit. At decision block 510, the method determines whether the maximum error is greater than a threshold. The maximum error is typically represented in percentage and has a range of one to one hundred percent. A low percentage indicates good accuracy and as the percentage gets higher the accuracy decreases. A threshold may be set by a user, a manufacturer, or the battery backup management system to trigger a recalibration. Another threshold may trigger an alarm to indicate that the battery is unserviceable. In one example, the recalibration threshold may be set five percent and the unserviceable threshold to ten percent. If the maximum error is greater than the recalibration threshold, then the "YES" branch is taken and the method proceeds to decision block 515. If the maximum error is equal to or less than the threshold, then the "NO" branch is taken and the method loops back. The method may perform the check at a certain interval, such as every few minutes, half an hour, hourly, etc.

At decision block 515, the method determines whether the battery is fully charged to one hundred percent state of charge. If the battery is fully charged, then the "YES" branch is taken and the method proceeds to decision block 525. If the battery is not fully charged, then the "NO" branch is taken and the method proceeds to block 520 where the method charges the battery to one hundred percent state of charge. The method may rest the battery for a period of time. In one example, the method may rest the battery for one hundred twenty minutes.

At decision block 525, the method determines whether the battery is in discharge/charge mode. If the battery is in the discharge/charge mode then the "YES" branch is taken and the method proceeds to decision block 510. If the battery is not in the discharge/charge mode then the "NO" branch is taken and the method proceeds to block 530.

At block 530, the method determines the reserve capacity based on the system power consumption and the discharge time. Different systems have different power consumption requirements. In this example, the system power consumption requirement is of the information handling system that is associated with the battery backup unit. The battery backup unit or the battery backup unit management system adjusts its terminal discharge point based on the reserve capacity, such that if the main power that supplies the information handling system, the battery backup unit has enough power to save the information handling system's data and perform a shutdown.

In one embodiment, the reserve capacity which is the system power consumption multiplied by the discharge time and is represented in milliamp-hour (mAh). The reserve capacity may be used to set the terminal discharge point of the battery backup unit. For example, if the power consumption of information handling system is ten amperes and the discharge time of the battery backup unit is six minutes which is equal to 0.1 hours, then the reserve capacity of the battery backup unit is equal to one thousand mAh which is ten amperes multiplied by the 0.1 hours.

At block 535, the method determines sets the end of discharge. Based on the calculations above, the full charge capacity of the battery backup unit is five thousand mAh, and the reserve capacity of one thousand mAh, which is equal to twenty percent of the full charge capacity. Accordingly, if the remaining capacity of the battery backup unit is one hundred percent, then the end of discharge may be set to twenty-one percent. That is the battery backup unit may be discharged from one hundred percent to twenty-one percent, which is before the reserve capacity.

At decision block 540, the method determines whether a learning cycle count is higher than a learning cycle count limit. The learning cycle count limit may have been set by the user, manufacturer, the battery backup unit management system. In one example, the learning cycle count may be set to five. If the learning cycle count is higher than the learning cycle count threshold then the "YES" branch is taken and the method ends. If the learning cycle count is equal to or less than the learning count threshold, then the "NO" branch is taken and the method proceeds to decision block 510.

Figure 6:
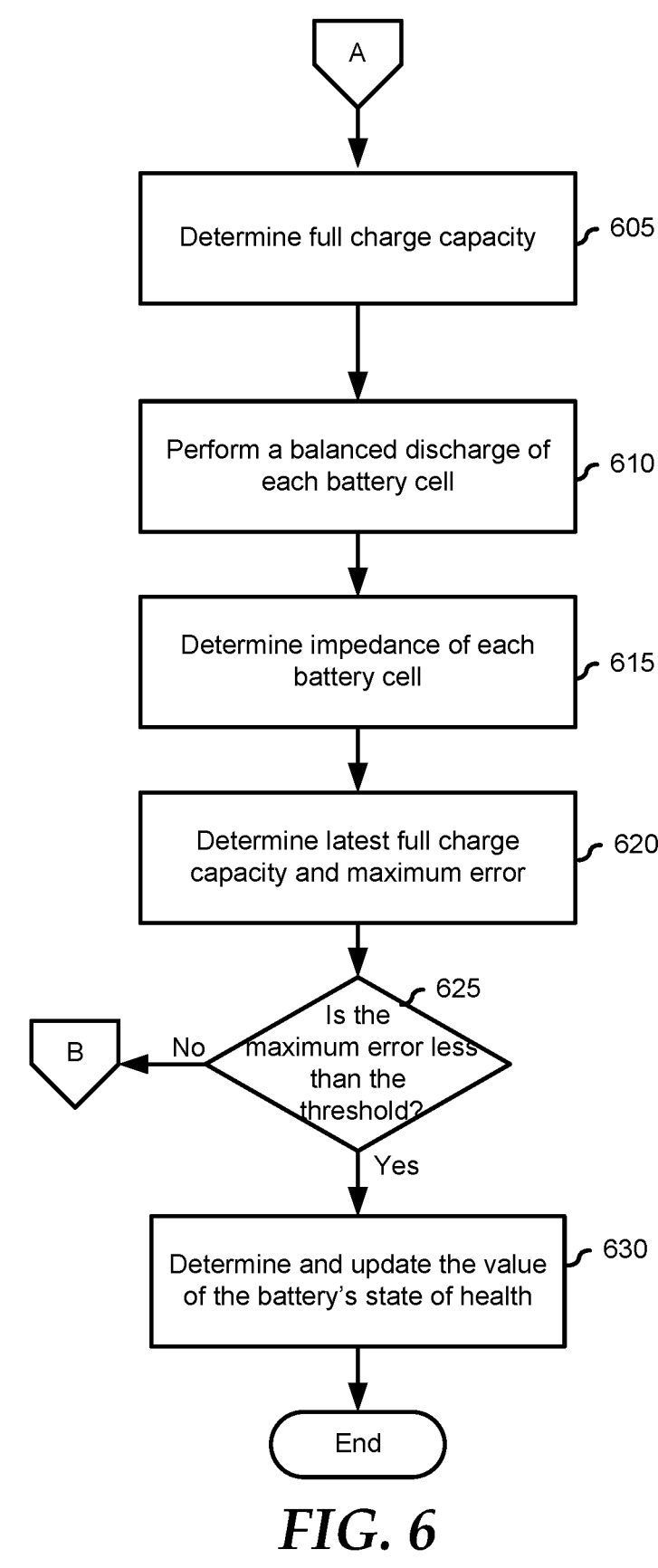

FIG. 6 shows a method 600 which is a continuation of method 500 of FIG. 5. Method 600 typically starts at block 605 where the method determines the full charge capacity of the battery or battery backup unit. The full charge capacity is equal to the initial capacity plus the passed charge and the remaining capacity. The initial capacity is the charge that would have passed to make a depth of discharge. The depth of discharge is the inverse of the state of charge and may be based on open-circuit voltage reading during a relaxed state of the battery or the battery backup unit. The depth of discharge indicates how much of a battery's charge has been used up. The remaining capacity is a percentage of total capacity and may be calculated based on voltage simulation. The method proceeds to block 610 where the method performs a balanced discharge of each battery cell as discussed in detail in FIG. 4 and FIG. 5.

At block 615, the method determines the cell impedance of each battery cell. The cell impedance can be measured based on the drop in voltage when the battery cell is discharged divided by the discharge current. The calibration module integrated circuit may be configured to control the cell balancing discharge circuit which may be used to calibrate each battery cell and other operations. For example, the calibration module integrated circuit may be configured to measure the voltage, current, and/or temperature of a battery or a battery cell. In addition, the calibration module integrated circuit may measure the cell voltage when the battery cell has a load and when the battery cell has no load.

At block 620, the method determines the cell's latest full charge capacity and maximum error. At this point, the method may recalculate the full charge capacity and the maximum error. The method may also add one to the learning cycle count. The method proceeds to decision block 625 where the method determines whether the maximum error is less than a threshold. In one example, the threshold is five percent. If the method determines that the maximum error is less than the threshold, then the "YES" branch is taken and the method proceeds to block 630. If the method determines that the maximum error is equal or greater than the threshold, then the "NO" branch is taken and the method proceeds to decision block 540 of FIG. 5. At block 630, the method determines and updates a current state of health value which is equal to the full charge capacity divided by the design capacity.

Although FIG. 5, and FIG. 6 show example blocks of method 500 and method 600 in some implementation, method 500 and method 600 may include additional blocks, fewer blocks, different blocks, or differently arranged blocks than those depicted in FIG. 5 and FIG. 6. Those skilled in the art will understand that the principles presented herein may be implemented in any suitably arranged processing system. Additionally, or alternatively, two or more of the blocks of method 500 and method 600 may be performed in parallel. For example, blocks 615 and 620 of method 600 may be performed in parallel.

In accordance with various embodiments of the present disclosure, the methods described herein may be implemented by software programs executable by a computer system. Further, in an exemplary, non-limited embodiment, implementations can include distributed processing, component/object distributed processing, and parallel processing. Alternatively, virtual computer system processing can be constructed to implement one or more of the methods or functionalities as described herein.

Throughout this disclosure, an alphabetic character following a numeral form of a reference numeral refers to a specific instance of an element and the numerical form of the reference numeral refers to the element generically. Thus, for example, battery "$210a$" refers to an instance of a device class, which may be referred to collectively as batteries "210" and any one of which may be referred to generically as battery "210".

When referred to as a "device," a "module," a "unit," a "controller," or the like, the embodiments described herein can be configured as hardware. For example, a portion of an information handling system device may be hardware such as, for example, an integrated circuit (such as an Application Specific Integrated Circuit (ASIC), a Field Programmable Gate Array (FPGA), a structured ASIC, or a device embedded on a larger chip), a card (such as a Peripheral Component Interface (PCI) card, a PCI-express card, a Personal Computer Memory Card International Association (PCM-CIA) card, or other such expansion card), or a system (such as a motherboard, a system-on-a-chip (SoC), or a stand-alone device).

The present disclosure contemplates a computer-readable medium that includes instructions or receives and executes instructions responsive to a propagated signal; so that a device connected to a network can communicate voice, video, or data over the network. Further, the instructions may be transmitted or received over the network via the network interface device.

While the computer-readable medium is shown to be a single medium, the term "computer-readable medium" includes a single medium or multiple media, such as a centralized or distributed database, and/or associated caches and servers that store one or more sets of instructions. The term "computer-readable medium" shall also include any medium that is capable of storing, encoding or carrying a set of instructions for execution by a processor or that cause a computer system to perform any one or more of the methods or operations disclosed herein.

In a particular non-limiting, exemplary embodiment, the computer-readable medium can include a solid-state memory such as a memory card or other package that houses one or more non-volatile read-only memories. Further, the computer-readable medium can be a random-access memory or other volatile re-writable memory. Additionally, the computer-readable medium can include a magneto-optical or optical medium, such as a disk or tapes or another storage device to store information received via carrier wave signals such as a signal communicated over a transmission medium. A digital file attachment to an e-mail or other self-contained information archive or set of archives may be considered a distribution medium that is equivalent to a tangible storage medium. Accordingly, the disclosure is considered to include any one or more of a computer-readable medium or a distribution medium and other equivalents and successor media, in which data or instructions may be stored.

Although only a few exemplary embodiments have been described in detail above, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents but also equivalent structures.

What is claimed is:

1. A method for calibrating a battery, the method comprising:

determining, by a processor, whether an expected margin of error during a calibration process of the battery is greater than a threshold;

in response to determining that the expected margin of error during the calibration process is greater than the threshold, determining whether the battery is fully charged;

in response to determining that the battery is fully charged, discharging the battery based on a reserve capacity, wherein the reserve capacity is based on a system power consumption multiplied by discharge time of the battery; and setting an end of discharge based on the reserve capacity, wherein the end of discharge is greater than the reserve capacity.

2. The method of claim 1, further comprising: in response to determining that the battery is not fully charged, charging the battery to be fully charged.

3. The method of claim 1, further comprising adjusting a discharge capacity of the battery based on the reserve capacity.

4. The method of claim 1, wherein the battery is a backup battery for an information handling system.

5. The method of claim 4, wherein the system power consumption of the information handling system is based on power for saving data and performing a shutdown during a power outage.

6. The method of claim 1, wherein the discharging of the battery is performed on each cell of the battery.

7. The method of claim 6, wherein the discharging of each battery cell is controlled by a transistor.

8. A battery management system, comprising:

a memory; and a processor associated with the memory and configured to:

determine whether an expected margin of error during a calibration process of a battery is greater than a threshold;

in response to a determination that the expected margin of error during the calibration process is greater than the threshold, determine whether the battery is fully charged;

in response to a determination that the battery is fully charged, discharge the battery based on a reserve capacity, wherein the reserve capacity is based on a system power consumption multiplied by discharge time of the battery; and setting an end of discharge based on the reserve capacity, wherein the end of discharge is greater than the reserve capacity.

9. The battery management system of claim 8, further comprising: in response to a determination that the battery is not fully charged, charge the battery until fully charged.

10. The battery management system of claim 8, wherein the processor is further configured to adjust a discharge capacity of the battery based on the reserve capacity.

11. The battery management system of claim 8, wherein the battery is a backup battery for an information handling system.

12. The battery management system of claim 11, wherein the the system power consumption of the information handling system is based on power for saving data and performing a shutdown during a power outage.

13. The battery management system of claim 8, wherein the discharge of the battery is performed on each cell of the battery.

14. The battery management system of claim 13, wherein the discharge of the each battery cell is controlled by a transistor.

15. A non-transitory computer-readable media to store instructions that are executable to perform operations comprising:

determining whether an expected margin of error during a calibration process of a battery is greater than a threshold;

if the expected margin of error during the calibration process of the battery is equal or greater than the threshold, then determining whether the battery is fully charged;

if the battery is not fully charged, then charging the battery until fully charged; and if the battery is fully charged, discharging the battery based on a reserve capacity, wherein the reserve capacity is based on a system power consumption multiplied by discharge time of the battery; and setting an end of discharge based on the reserve capacity, wherein the end of discharge is greater than the reserve capacity.

16. The non-transitory computer-readable media of claim 15, wherein the operations further comprise: if the battery is not fully charged, then charging the battery until fully charged.

17. The non-transitory computer-readable media of claim 15, wherein the operations further comprise adjusting discharge capacity of the battery based on the reserve capacity.

18. The non-transitory computer-readable media of claim 15, wherein the system power consumption of an information handling system is based on power for saving data and performing a shutdown during a power outage.

19. The non-transitory computer-readable media of claim 15, wherein the discharging of the battery is performed on each cell of the battery.

20. The non-transitory computer-readable media of claim 19, wherein the discharging of the each battery cell is controlled by a transistor.

* * * * *